US011819087B2

(12) United States Patent
Donohoe

(10) Patent No.: US 11,819,087 B2
(45) Date of Patent: Nov. 21, 2023

(54) AUTOLACING FOOTWEAR MOTOR HAVING FORCE-DIRECTING SUPPORTS

(71) Applicant: NIKE, Inc., Beaverton, OR (US)

(72) Inventor: Brendan Donohoe, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 619 days.

(21) Appl. No.: 16/694,306

(22) Filed: Nov. 25, 2019

(65) Prior Publication Data

US 2020/0170331 A1 Jun. 4, 2020

Related U.S. Application Data

(60) Provisional application No. 62/773,842, filed on Nov. 30, 2018, provisional application No. 62/773,867, filed on Nov. 30, 2018.

(51) Int. Cl.
*A43B 3/34* (2022.01)
*A43C 11/16* (2006.01)
(Continued)

(52) U.S. Cl.
CPC .................. *A43B 3/34* (2022.01); *A43C 1/04* (2013.01); *A43C 1/06* (2013.01); *A43C 7/08* (2013.01);
(Continued)

(58) Field of Classification Search
CPC .. A43B 3/34; A43B 11/00; A43C 1/04; A43C 1/06; A43C 7/08; A43C 11/165;
(Continued)

(56) References Cited

U.S. PATENT DOCUMENTS 5,303,485 A    4/1994  Goldston et al.
5,323,650 A *  6/1994  Fullen .................. A61B 5/1036
                                                        600/592
(Continued)

FOREIGN PATENT DOCUMENTS

CN         101154429        4/2008
CN         101562957        10/2009
(Continued)

OTHER PUBLICATIONS

"U.S. Appl. No. 16/694,327, Response filed Nov. 8, 2021 to Restriction Requirement dated Sep. 7, 2021", 7 pgs.
(Continued)

*Primary Examiner* — Katharine G Kane
(74) *Attorney, Agent, or Firm* — Schwegman, Lundberg & Woessner, P.A.

(57) ABSTRACT

An article of footwear, motorized lacing system, and method includes a motor, a transmission, operatively coupled to the motor, a power source, operatively coupled to the motor, a lace spool, operatively coupled to the motor via the transmission, configured to spool and unspool the lace based on operation of the motor, a printed circuit board, and a housing. The housing contains the motor, the transmission, the power source, the lace spool and the printed circuit board, the printed circuit board positioned between an interior surface of the housing and at least one of the power source and the motor, wherein the interior surface includes a post that extends through a hole formed in the printed circuit board. A flexing of the interior surface causes force on the housing to be at least partially imparted on the at least one of the power source, the transmission, and the motor.

7 Claims, 14 Drawing Sheets

(51) Int. Cl.
 B65H 75/44 (2006.01)
 A43C 1/04 (2006.01)
 A43C 1/06 (2006.01)
 A43C 7/08 (2006.01)
 H05K 5/02 (2006.01)
 A43B 11/00 (2006.01)

(52) U.S. Cl.
 CPC ........ *A43C 11/165* (2013.01); *B65H 75/4484* (2013.01); *B65H 75/4486* (2013.01); *H05K 5/02* (2013.01); *A43B 11/00* (2013.01); *B65H 2403/40* (2013.01); *H05K 2201/10121* (2013.01)

(58) Field of Classification Search
 CPC ............ B65H 75/4484; B65H 75/4486; B65H 2403/40; H05K 5/02
 See application file for complete search history.

(56) References Cited

U.S. PATENT DOCUMENTS

| | | | |
|---|---|---|---|
| 5,599,088 A * | 2/1997 | Chien | A43B 3/34 36/137 |
| 5,813,148 A * | 9/1998 | Guerra | A43B 3/0078 36/137 |
| 6,427,361 B1 | 8/2002 | Chou | |
| 6,691,433 B2 | 2/2004 | Liu | |
| 7,426,873 B1 * | 9/2008 | Kholwadwala | A43B 3/00 73/818 |
| 7,721,468 B1 * | 5/2010 | Johnson | A43C 1/06 36/118.1 |
| 8,046,937 B2 * | 11/2011 | Beers | A43C 11/165 36/50.1 |
| 8,676,541 B2 * | 3/2014 | Schrock | A61B 5/1038 702/188 |
| 8,904,672 B1 | 12/2014 | Johnson | |
| 9,578,926 B2 | 2/2017 | Alt et al. | |
| 10,034,622 B1 | 7/2018 | Mahmoud | |
| 11,185,130 B2 | 11/2021 | Bock et al. | |
| 11,209,070 B2 | 12/2021 | Orand | |
| 11,470,910 B2 | 10/2022 | Donohoe et al. | |
| 2003/0150135 A1 | 8/2003 | Liu | |
| 2003/0204938 A1 * | 11/2003 | Hammerslag | A43C 11/004 24/68 SK |
| 2005/0030734 A1 * | 2/2005 | Botzer | A44C 15/0015 362/84 |
| 2006/0191164 A1 | 8/2006 | Dinndorf et al. | |
| 2007/0000154 A1 | 1/2007 | Dibenedetto et al. | |
| 2009/0272007 A1 * | 11/2009 | Beers | A43C 11/00 36/50.1 |
| 2009/0272013 A1 * | 11/2009 | Beers | A43B 3/0078 36/137 |
| 2012/0217982 A1 * | 8/2012 | Narayanasamy | G06F 3/016 324/686 |
| 2013/0213144 A1 * | 8/2013 | Rice | A43B 13/186 73/862.68 |
| 2013/0213147 A1 * | 8/2013 | Rice | A43B 7/088 73/862.046 |
| 2014/0068838 A1 * | 3/2014 | Beers | A43C 1/00 2/243.1 |
| 2014/0082963 A1 | 3/2014 | Beers | |
| 2014/0165378 A1 | 6/2014 | Mann et al. | |
| 2014/0165427 A1 * | 6/2014 | Molyneux | A43B 3/34 36/102 |
| 2014/0200834 A1 * | 7/2014 | Ross | A61B 5/1038 702/41 |
| 2015/0108353 A1 | 4/2015 | Geiger et al. | |
| 2016/0345681 A1 * | 12/2016 | Pheil | A43B 3/34 |
| 2017/0265571 A1 * | 9/2017 | Beers | A63B 71/08 |
| 2017/0265577 A1 * | 9/2017 | Schneider | A43B 3/36 |
| 2017/0265579 A1 | 9/2017 | Schneider et al. | |
| 2017/0265581 A1 * | 9/2017 | Chang | A43C 7/00 |
| 2017/0265586 A1 * | 9/2017 | Schneider | A43C 1/00 |
| 2017/0265591 A1 * | 9/2017 | Schneider | B65H 59/00 |
| 2017/0265593 A1 * | 9/2017 | Schneider | B65H 69/00 |
| 2017/0265594 A1 * | 9/2017 | Walker | G01L 1/12 |
| 2017/0267485 A1 * | 9/2017 | Schneider | A43C 7/00 |
| 2017/0272008 A1 * | 9/2017 | Schneider | A43C 11/165 |
| 2018/0199671 A1 | 7/2018 | Schneider et al. | |
| 2018/0199674 A1 * | 7/2018 | Walker | A43B 3/36 |
| 2018/0343977 A1 * | 12/2018 | Riccomini | B65H 75/4428 |
| 2019/0104808 A1 * | 4/2019 | Kovach | A43B 3/34 |
| 2019/0116937 A1 * | 4/2019 | Avar | A43B 3/34 |
| 2020/0170351 A1 | 6/2020 | Donohoe et al. | |
| 2023/0030904 A1 | 2/2023 | Donohoe et al. | |

FOREIGN PATENT DOCUMENTS

| | | |
|---|---|---|
| CN | 206238563 | 6/2017 |
| CN | 113163890 | 7/2021 |
| CN | 113163903 | 7/2021 |
| CN | 113163890 | 2/2022 |
| CN | 114631667 A | 6/2022 |
| EP | 2388556 | 11/2011 |
| JP | S5629467 | 3/1981 |
| JP | H05203464 | 8/1993 |
| JP | 2002277286 | 9/2002 |
| JP | 2005308483 A | 11/2005 |
| JP | 2007327912 | 12/2007 |
| JP | 2022508290 | 1/2022 |
| JP | 2022511460 | 1/2022 |
| JP | 7196305 B2 | 12/2022 |
| JP | 202330017 A | 3/2023 |
| KR | 20170001249 | 1/2017 |
| KR | 20210068146 | 6/2021 |
| KR | 20210087061 | 7/2021 |
| KR | 102373735 B1 | 3/2022 |
| KR | 20220038502 A | 3/2022 |
| KR | 102489210 B1 | 1/2023 |
| KR | 20230014849 A | 1/2023 |
| TW | 200811845 | 3/2008 |
| WO | 02098256 | 12/2002 |
| WO | 2016195957 | 12/2016 |
| WO | 2017160558 | 9/2017 |
| WO | 2017160561 | 9/2017 |
| WO | 2017161000 | 9/2017 |
| WO | 2020112637 | 6/2020 |
| WO | 2020112638 | 6/2020 |
| WO | 2020217178 | 10/2020 |

OTHER PUBLICATIONS

"Korean Application Serial No. 10-2021-7016459, Response filed Nov. 25, 2021 to Notice of Preliminary Rejection dated Sep. 1, 2021", w English claims, 11 pgs.

"Japanese Application Serial No. 2021-531013, Notification of Reasons for Refusal dated Jan. 4, 2022", With Concise Statement, 4 pgs.

"European Application Serial No. 19888492.6, Response to Communication Pursuant to Rules 161 and 162 EPC filed Dec. 22, 2021", 12 pgs.

"European Application Serial No. 19889528.6, Response to Communication Pursuant to Rules 161 and 162 EPC filed Dec. 22, 2021", 12 pgs.

"U.S. Appl. No. 16/694,327, Restriction Requirement dated Jan. 13, 2022", 6 pgs.

"U.S. Appl. No. 16/694,327, Restriction Requirement dated Sep. 7, 2021", 7 pgs.

"Korean Application Serial No. 10-2021-7016459, Notice of Preliminary Rejection dated Sep. 1, 2021", w English Translation, 5 pgs.

"International Application Serial No. PCT US2019 063009, International Preliminary Report on Patentability dated Jun. 10, 2021", 6 pgs.

"International Application Serial No. PCT US2019 063012, International Preliminary Report on Patentability dated Jun. 10, 2021", 6 pgs.

"International Application Serial No. PCT US2019 063009, International Search Report dated Mar. 11, 2020", 4 pgs.

(56) References Cited

OTHER PUBLICATIONS

"International Application Serial No. PCT US2019 063009, Written Opinion dated Mar. 11, 2020", 4 pgs.
"U.S. Appl. No. 16/694,327, Corrected Notice of Allowability dated Sep. 20, 2022", 4 pgs.
"Japanese Application Serial No. 2021-531013, Response filed Sep. 6, 2022 to Notification of Reasons for Rejection dated Jun. 7, 2022", w English Claims, 13 pgs.
"U.S. Appl. No. 16/694,327, Notice of Allowance dated Jun. 7, 2022", 7 pgs.
"U.S. Appl. No. 16/694,327, Response filed Apr. 13, 2022 to Restriction Requirement dated Jan. 13, 2022", 7 pgs.
"Japanese Application Serial No. 2021-531013, Notification of Reasons for Rejection dated Jun. 7, 2022", W/English Translation, 5 pgs.
"International Application Serial No. PCT US2019 063012, International Search Report dated Apr. 22, 2020", 4 pgs.
"International Application Serial No. PCT US2019 063012, Written Opinion dated Apr. 22, 2020", 4 pgs.
U.S. Appl. No. 16/694,327, U.S. Pat. No. 11,470,910, filed Nov. 25, 2019, Autolacing Footwear Motor Having Rotary Drum Encoder.
U.S. Appl. No. 17/967,064, filed Oct. 17, 2022, Autolacing Footwear Motor Having Rotary Drum Encoder.
"European Application Serial No. 19888492.6, Extended European Search Report dated Jul. 7, 2022", 8 pgs.
"European Application Serial No. 19889528.6, Extended European Search Report dated Jul. 7, 2022", 9 pgs.
"Chinese Application Serial No. 201980078402.4, Office Action dated Jul. 1, 2022", w English translation, 17 pgs.
"Korean Application Serial No. 10-2022-7007618, Notice of Preliminary Rejection dated Aug. 9, 2022", w English translation, 6 pgs.
"Japanese Application Serial No. 2021-531013, Response filed Mar. 7, 2022 to Notification of Reasons for Refusal dated Jan. 4, 2022", w English claims, 17 pgs.
"Chinese Application Serial No. 201980078402.4, Office Action dated Jan. 19, 2023", With English machine translation, 12 pgs.
"Chinese Application Serial No. 201980078402.4, Response filed Mar. 20, 2023 to Office Action dated Jan. 19, 2023", w/ English claims, 29 pgs.
"Chinese Application Serial No. 201980078402.4, Response filed Nov. 1, 2022 to Office Action dated Jul. 1, 2022", w/ English claims, 8 pgs.
"European Application Serial No. 19888492.6, Response filed Jan. 31, 2023 to Extended European Search Report dated Jul. 7, 2022", 29 pgs.
"European Application Serial No. 19889528.6, Response filed Jan. 26, 2023 to Extended European Search Report dated Jul. 7, 2022", 29 pgs.
"Korean Application Serial No. 10-2022-7007618, Response filed Oct. 6, 2022 to Notice of Preliminary Rejection dated Aug. 9, 2022", w/ English claims, 13 pgs.
"Korean Application Serial No. 10-2023-7001267, Voluntary Amendment filed Feb. 2, 2023", w/ English claims, 20 pgs.
"Chinese Application Serial No. 201980078402.4, Response filed Aug. 14, 2023 to Office Action dated May 29, 2023", w English claims (not amended), 10 pgs.

* cited by examiner

AUTOLACING FOOTWEAR MOTOR HAVING FORCE-DIRECTING SUPPORTS

PRIORITY APPLICATIONS

This application claims the benefit of priority to U.S. Provisional Application Ser. No. 62/773,842, filed Nov. 30, 2018 and U.S. Provisional Application Ser. No. 62/773,867, filed Nov. 30, 2018, the contents of which are incorporated herein by reference in their entireties.

TECHNICAL FIELD

The subject matter disclosed herein generally relates to an article of footwear having an autolacing motor having supports that extend through a printed circuit board (PCB) to reduce stress on the PCB.

BACKGROUND

Articles of footwear, such as shoes, may include a variety of components, both conventional and unconventional. Conventional components may include an upper, a sole, and laces or other securing mechanisms to enclose and secure the foot of a wearer within the article of footwear. Unconventionally, a motorized lacing system may engage with the lace to tighten and/or loosen the lace. Additional or alternative electronics may provide a variety of functionality for the article of footwear, including operating and driving the motor, sensing information about the nature of the article of footwear, providing lighted displays and/or other sensory stimuli, and so forth.

BRIEF DESCRIPTION OF THE DRAWINGS

Some embodiments are illustrated by way of example and not limitation in the figures of the accompanying drawings.

DETAILED DESCRIPTION

Example methods and systems are directed to an article of footwear having an autolacing motor having supports to reduce force on a PCB. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

In general, and particularly for articles of footwear oriented toward the performance of athletic activities, characteristics such as the size, form, robustness, and weight of the article of footwear may be of particular importance. Where the components of the article of footwear promote, for instance, a relatively tall, heavy, and/or fragile article of footwear, the capacity of the article of footwear to be effective in the performance of the athletic activity may be compromised.

Components of an autolacing system may be included in a housing and positioned on or within the article of footwear, e.g., within a sole structure. However, electronic components may be susceptible to otherwise ordinary forces on an article of footwear. For instance, if a wearer steps on a rock or other hard protrusion, force may be imparted through the sole to the housing, which may flex and impart force on the components contained within. Certain components may be relatively more mechanically robust than others. Thus, if the force is imparted on the battery or on the motor, for instance, then the risk of damage to the system may be less than if the force is imparted on a printed circuit board (PCB) or electronic connector.

However, design considerations related to height and ease of manufacture may make it desirable to place the PCB in a location generally in proximity of a surface of the housing that would typically be oriented closest to the sole. Thus, force on the sole that flexes the housing may result in an undesirable amount of the force being imparted on the PCB. To reduce the force that may tend to be imparted on the PCB, and to direct the force instead to components of the autolacing system which may be relatively more robust than the PCB, one or more supports have been designed in the housing proximate the sole that extend through the PCB and in proximity of another component of the autolacing system, e.g., the motor. When a force is imparted on the housing and the housing flexes, the support contacts the other component and imparts at least some of the force into that component rather than on the PCB. While the supports may not prevent any force from being imparted on the PCB, the supports may direct enough force away from the PCB to limit the force imparted on the PCB to tolerable limits.

Figure 1:
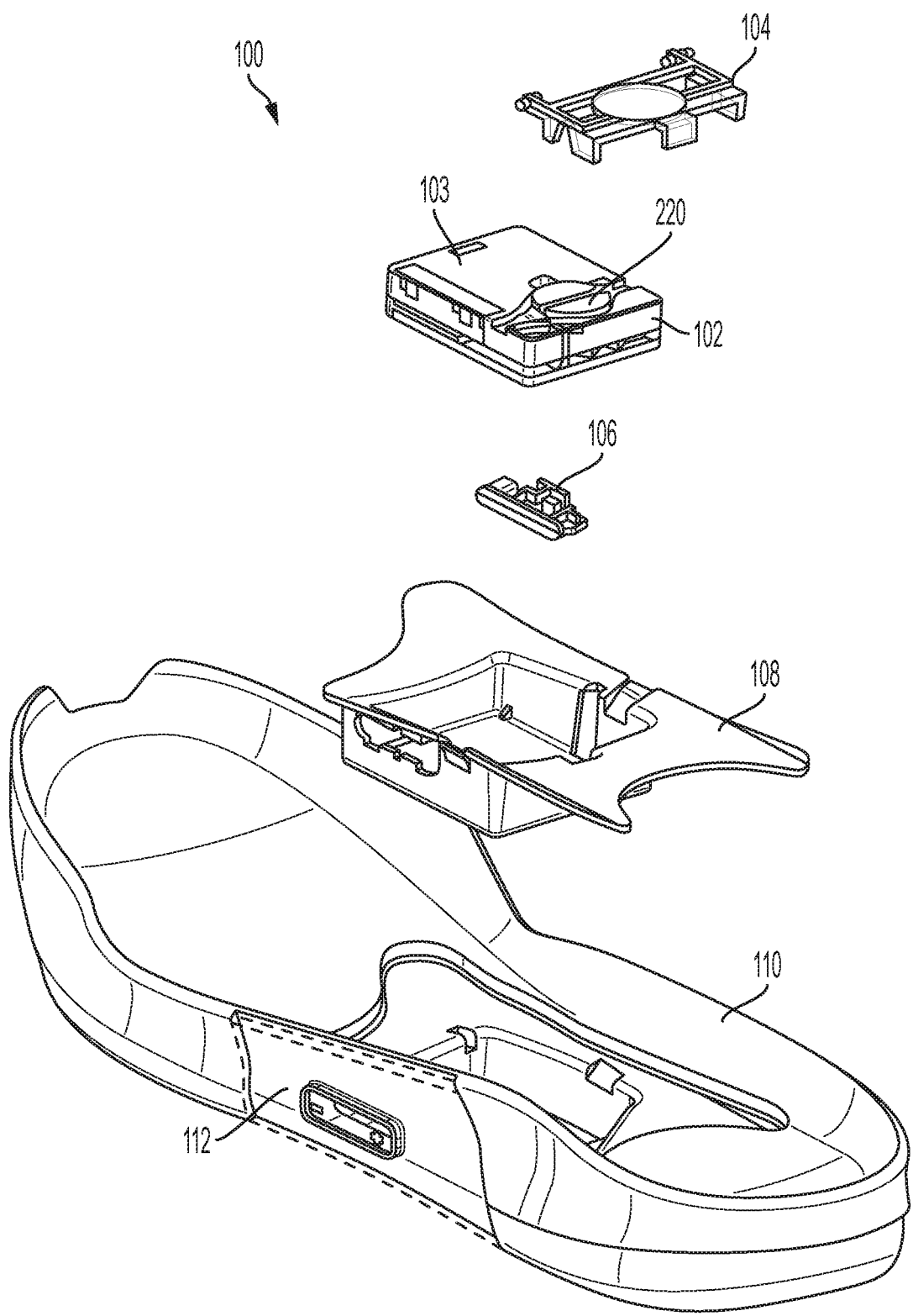
FIG. 1 is an exploded view illustration of components of a motorized lacing system for an article of footwear, in an example embodiment.

FIG. 1 is an exploded view illustration of components of a motorized lacing system for an article of footwear, in an example embodiment. While the system is described with respect to the article of footwear, it is to be recognized and understood that the principles described with respect to the article of footwear apply equally well to any of a variety of wearable articles. The motorized lacing system 100 illustrated in FIG. 1 includes a lacing engine 102 having a housing structure 103, a lid 104, an actuator 106, a mid-sole plate 108, a mid-sole 110, and an outsole 112. FIG. 1 illustrates the basic assembly sequence of components of an automated lacing footwear platform. The motorized lacing system 100 starts with the mid-sole plate 108 being secured within the mid-sole. Next, the actuator 106 is inserted into an opening in the lateral side of the mid-sole plate opposite to interface buttons that can be embedded in the outsole 112.

Next, the lacing engine 102 is dropped into the mid-sole plate 108. In an example, the lacing system 100 is inserted under a continuous loop of lacing cable and the lacing cable is aligned with a spool in the lacing engine 102 (discussed below). Finally, the lid 104 is inserted into grooves in the mid-sole plate 108, secured into a closed position, and latched into a recess in the mid-sole plate 108. The lid 104 can capture the lacing engine 102 and can assist in maintaining alignment of a lacing cable during operation.

Figure 2:
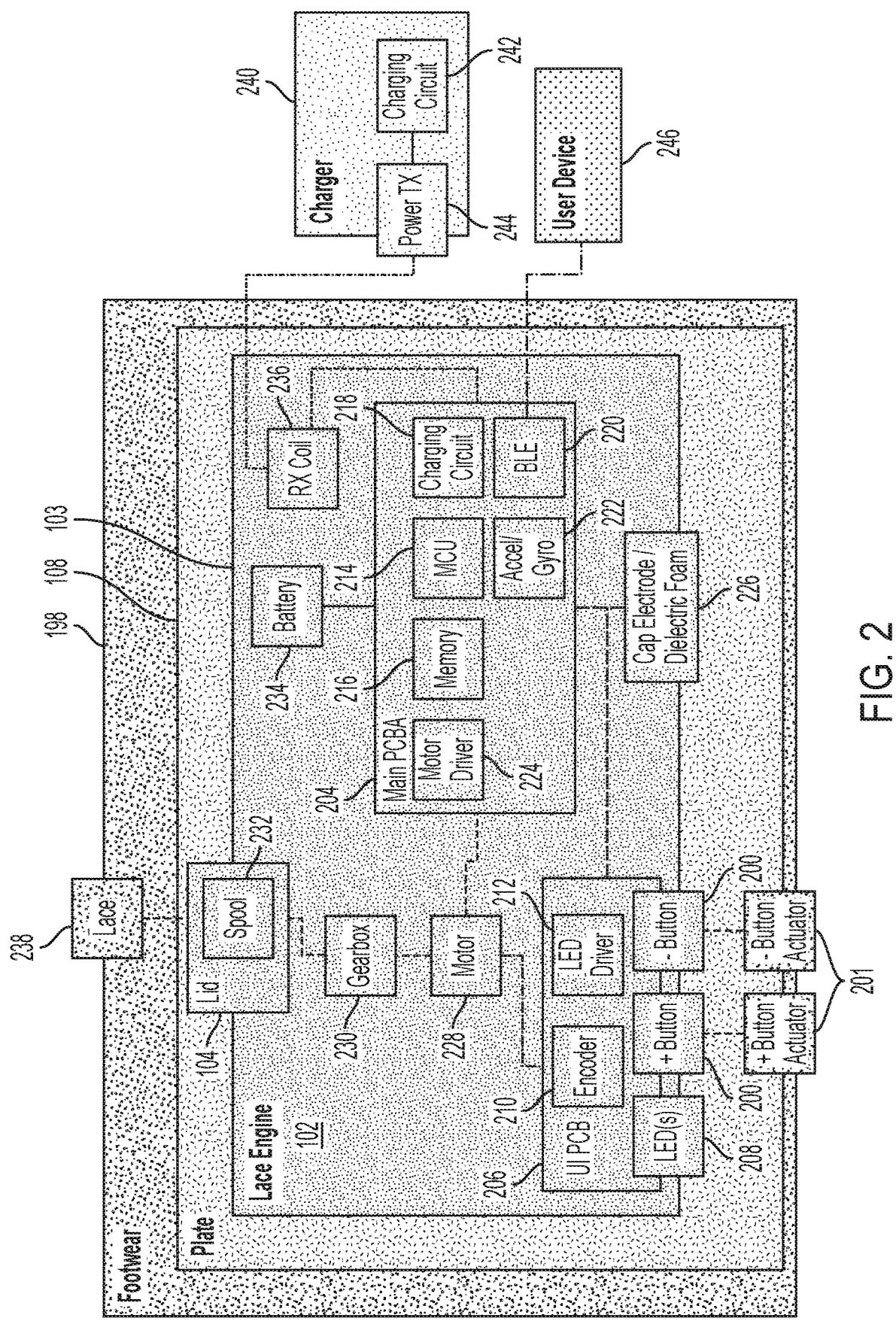
FIG. 2 illustrates generally a block diagram of components of a motorized lacing system, in an example embodiment.

FIG. 2 illustrates generally a block diagram of components of a motorized lacing system 100, in an example embodiment. The system 100 includes some, but not necessarily all, components of a motorized lacing system, including the lacing engine 102, the mid-sole plate 108, and the underlying footwear 198. The system 100 as illustrated includes interface buttons 200, interface button actuators 201, a foot presence sensor 202, and the lacing engine housing 103 enclosing a main PCB 204 and a user interface PCB 206. The user interface PCB 206 includes the buttons 200, one or more light emitting diodes (LEDs) 208 which may illuminate the button actuators 201 or otherwise provide illumination visible outside of the article of footwear, an optical encoder unit 210, and an LEI) driver 212 which may provide power to the LEDs 208. The main PCB 204 includes a processor circuit 214, an electronic data storage 216, a battery charging circuit 218, a wireless transceiver 220, one or more sensors 222, such as accelerometers, gyroscopes, and the like, and a motor driver 224.

The lacing engine 102 further includes a foot presence sensor 226, such as a capacitive sensor, a motor 228, a transmission 230, a spool 232, a battery or power source 234, and a charging coil 236. The processor circuit 214 is configured with instructions from the electronic data storage 216 to cause motor driver 224 to activate the motor 228 to turn the spool 232 by way of the transmission 230 in order to place a desired amount of tension on a lace 238 wound about the spool 232. The processor circuit 214 may receive inputs from a variety of sources, including the foot presence sensor 226, the sensors 222, and the buttons 200, to decide, according to the instructions, to increase or decrease the tension on the lace 238. For instance, the foot presence sensor 226 may detect the presence of a foot in the footwear 198, and the processor circuit 216 may set the tension to a present tension level. The sensors 222 may detect movement consistent with a particular activity level, e.g., causal walking, a vigorous physical activity, etc., and the processor circuit 214 may cause the tension to be set to a level consistent with that activity level, e.g., relatively loose for casual walking and relatively tight for vigorous physical activity. A user may press the button actuators 201 to manually command an incremental or linear increase or decrease in tension as desired.

The battery 234 provides power for the components of the lacing engine 102 in general and is, in the example embodiment, a rechargeable battery. However, alternative power sources, such as non-rechargeable batteries, super capacitors, and the like, are also contemplated. In the illustrated example, the battery 234 is coupled to the charging circuit 218 and the recharge coil 236. When the recharge coil 236 is placed in proximity of an external charger 240, a charging circuit 242 may energize a transmit coil 244 to inductively induce a current in the recharge coil 236, which is then utilized by the charging circuit 218 to recharge the battery 234. Alternative recharging mechanisms are contemplated, such as a piezoelectric generator located within the footwear 198.

The wireless transceiver 220 is configured to communicate wirelessly with a remote user device 246, such as a smartphone, wearable device, tablet computer, personal computer, and the like. In example, the wireless transceiver 220 is configured to communicate according to the Bluetooth Low Energy modality, though the wireless transceiver 220 may communicate according to any suitable wireless modality, including near field communication (NFC), 802.11 WiFi, and the like. Moreover, the wireless transceiver 220 may be configured to communicate with multiple external user devices 246 and/or according to multiple different wireless modalities. The wireless transceiver 220 may receive instructions from the user device 246, e.g., using an application operating on the user device 246, for controlling the lacing engine 102, including to enter predetermined modes of operation or to incrementally or linearly increase or decrease the tension on the lace 238. The wireless transceiver 220 may further transmit information about the lace engine 102 to the user device 246, e.g., an amount of tension on the lace 238 or otherwise an orientation of the spool 232, an amount of charge remaining on the battery 234, and any other desired information about the lacing engine 102 generally.

Figure 3A:
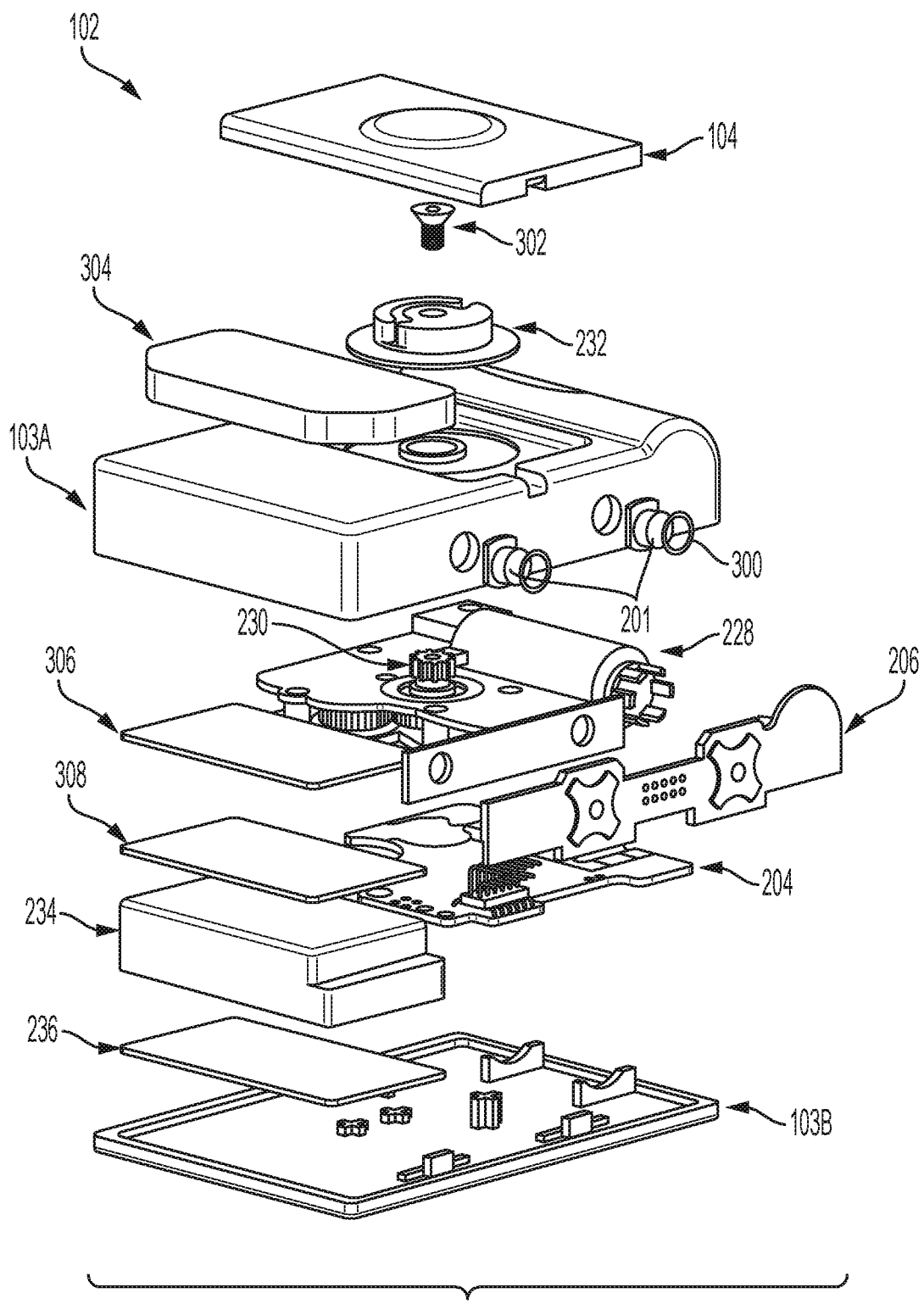
FIG. 3A is an exploded view of the lacing engine, in an example embodiment.

FIG. 3A is an exploded view of the lacing engine 102, in an example embodiment. The lacing engine 102 includes the housing 103, which includes an upper portion 103A and a lower portion 103B, which enclose the lacing engine 102 generally, except for certain components which are exterior of the housing 103. Those components include the button actuators 201 (and related O-rings 300 for protecting the lacing engine 102 against environmental conditions, such as moisture), the spool 232, which is secured to the transmission 230 via a setscrew 302 and which is enclosed with the lid 104, and a dielectric foam 304 of the foot presence sensor 226. Enclosed within the housing 103 is the main PCB 204, the user interface PCB 206, the motor 228, the transmission 230, the battery 234, the recharge coil 236, and an electrode 306 and foam 308 of the foot presence sensor 226.

Partially visible in the exploded view is the optical encoder unit 210. Specifically, a three-dimensional encoder 310 of the optical encoder unit 210 is coupled to the motor 228 and turns with the turning of the motor. Specific implementations of the three-dimensional encoder 310 are illustrated herein.

Figure 3B:
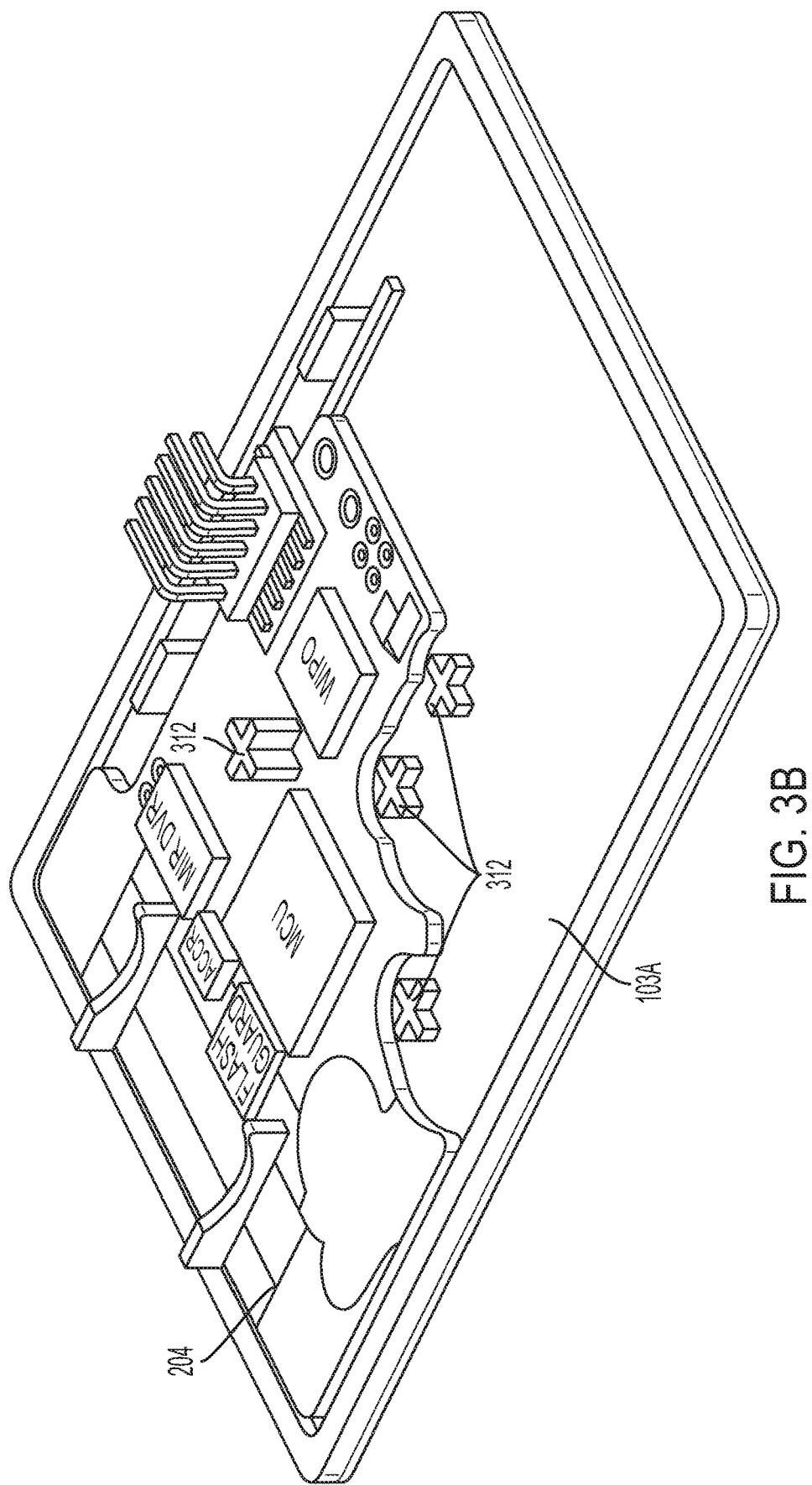
FIG. 3B is a view of the lower portion of the housing in relation to the main PCB.

FIG. 3B is a view of the lower portion 103B of the housing 103 in relation to the main PCB 204, Included in the lower portion 1038 are posts 312 extending from in interior surface 314 of the lower portion 103B of the housing 103. As will be illustrated herein, at least one of the posts 312 extend through a hole in the main PCB 204 (not visible). When an external force is placed on the exterior of the lower portion 103B of the housing 103, e.g., because a wearer of the footwear 198 steps on an object that imparts force through the mid-sole 110 and plate 108 (FIG. 1), the lower portion 103B may flex. The posts 312 are positioned such that the flexing of the lower portion 103B may result in one or more of the posts 312 contacting a relatively more solid or resilient component of the lacing engine 102, e.g., the motor 228, the transmission 230, or the battery 234, rather than the a relatively less resilient component, such as the main PCB 204. As illustrated, the posts 312 are in the shape of a plus-symbol to efficiently distribute forces. However, it is to be recognized and understood that the posts 312 may be in any suitable shape or size.

Figure 4A:
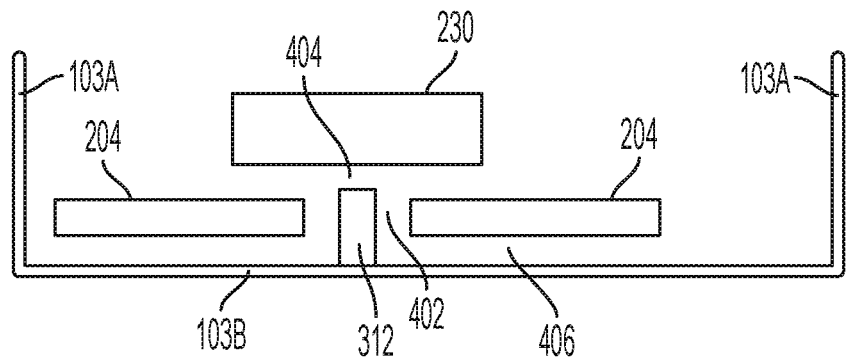
FIGS. 4A and 4B are sequential block diagrams illustrating the function of a post when a force is imparted on the lower portion, in an example embodiment.
Figure 4B:
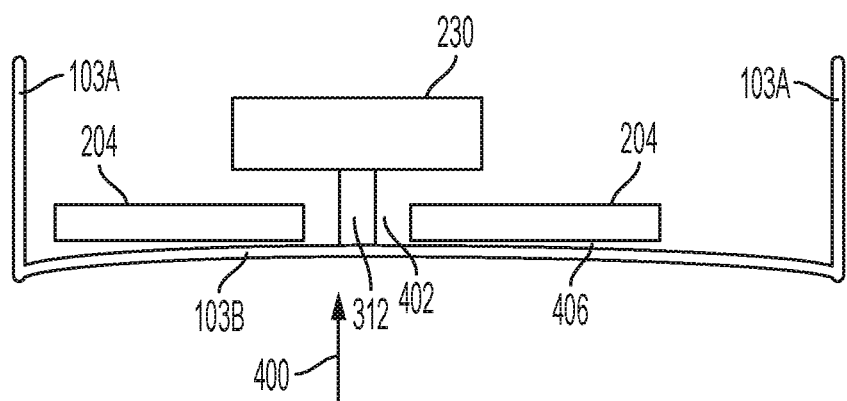

FIGS. 4A and 4B are sequential block diagrams illustrating the function of a post 312 when a force 400 is imparted on the lower portion 103B, in an example embodiment. The block diagram has been simplified and exaggerated for the purposes of illustration. It is to be recognized that multiple posts 312 may be implemented according to the principles illustrated herein across a variety of locations, as illustrated in FIG. 3B, and that the posts 312 may be positioned and configured to contact any suitable resilient component, as noted herein.

FIG. 4A shows the lower portion 103B coupled to the upper portion 103A with a post 312 projecting from the interior surface 314 of the lower portion 103B. The post 312 extends through a hole 402 formed in the main PCB 204. As illustrated, the post does not contact the transmission 230 but rather has a gap 404 therebetween. In various examples, the gap 404 is less than a gap 406 between the main PCB 204 and the interior surface 314. However, it is to be recognized that there may not be a gap 404 or that the gap 404 may be approximately the same as the gap 406. As no force has been imparted on the lower portion 103B, the lower portion 103B is substantially flat and linear.

FIG. 4B shows the lower portion 103B bowed on account of the force 400 imparted on the lower portion 103B. The bowing of the lower portion 103B has caused the post 312 to contact the transmission 230, transferring at least some of the force 400 to the transmission 230. While the gap 404 between the post 312 and the transmission 230 has been eliminated, at least some gap 406 remains between the interior surface 314 and the main PCB 204. As a result, in this example, no portion of the force 400 is imparted on the relatively fragile main PCB 204 and is instead imparted on the more resilient transmission 230.

It is to be recognized and understood that while the exaggerated illustration shows no contact between the lower portion 103B and the main PCB 204, actual implementations may nonetheless result in some contact between the lower portion 103B and the main PCB 204, and/or that at least some of the force 400 is imparted on the main PCB 204. However, at minimum, the presence of the post 312 may tend to cause at least some of the force 400 to be imparted on the transmission 230 rather than on to the main PCB 204. A relative reduction in the amount of force 400 imparted on the main PCB 204 than would be the case without the post 312 may still reduce a likelihood of the main PCB 204 being damage from imparted force 400 on the lower portion 103B.

Figure 5A:
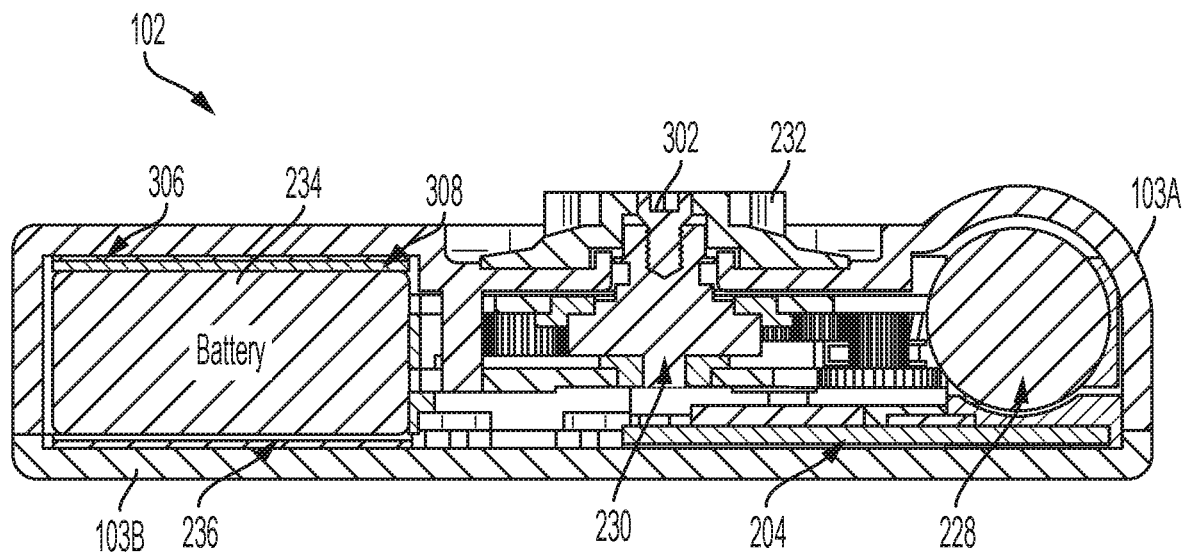
FIGS. 5A and 5B are side and perspective views of the lace engine, in an example embodiment.
Figure 5B:
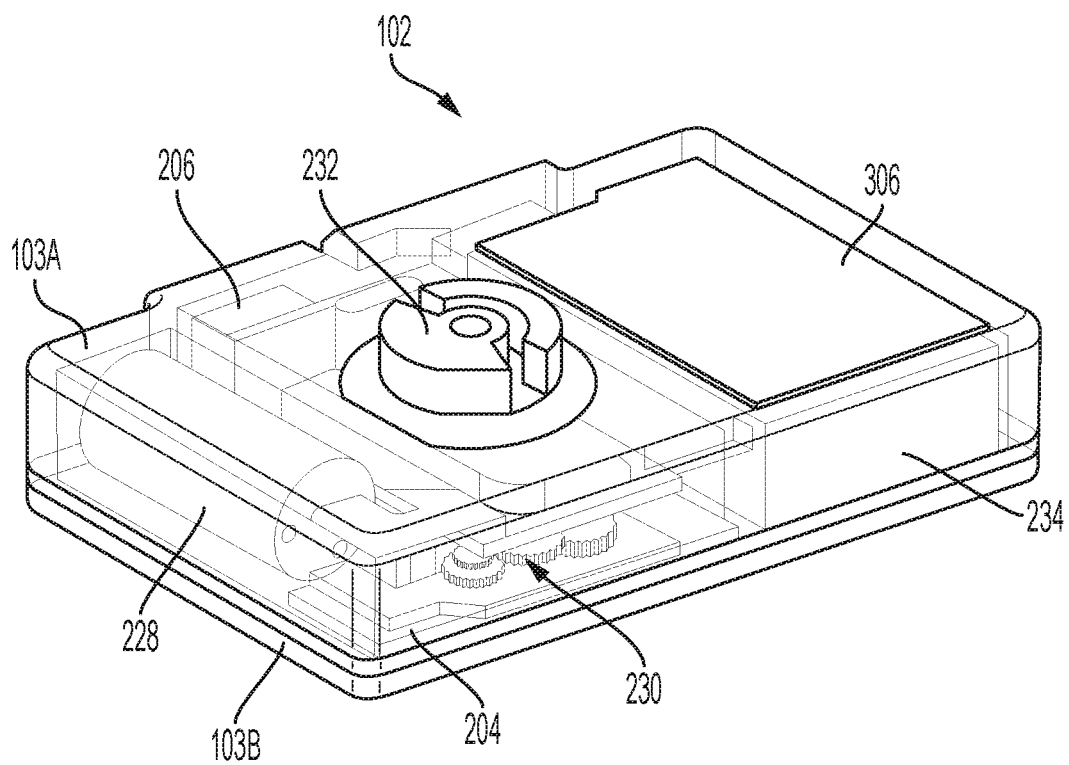

FIGS. 5A and 5B are side and perspective views of the lace engine 102, in an example embodiment. Components such as the main PCB 204, user interface PCB 206, motor 228, transmission 230, battery 234, electrode 306, foam 308, and recharge coil 236 are contained within the top portion 103A and bottom portion 103B of the housing 103. The spool 232 is secured to the transmission 230 via the set screw 302. The top portion 103A generally conforms to a curved contour of the motor 228.

In an example, the top portion 103A and bottom portion 103B are each approximately 1.5 millimeters thick. The recharge coil 236 is approximately 0.7 millimeters thick, including a ferrite backing. The battery 234 is approximately 7.5 millimeters thick, accounting for a swelling of the battery 234 over time. In an example, the electrode 306 is approximately 0.25 millimeters thick and the foam 308 is approximately 0.5 millimeters thick, providing for a total thickness of the lace engine 102 proximate the battery 234 of approximately 11.75 millimeters. In an example, the motor 228 is approximately 8.5 millimeters thick and the lace engine 102 proximate the motor 228 has a maximum thickness of approximately 14.55 millimeters. In an example, the lace engine 102 proximate the spool 232 has a thickens of approximately 14.7 millimeters.

Figure 6:
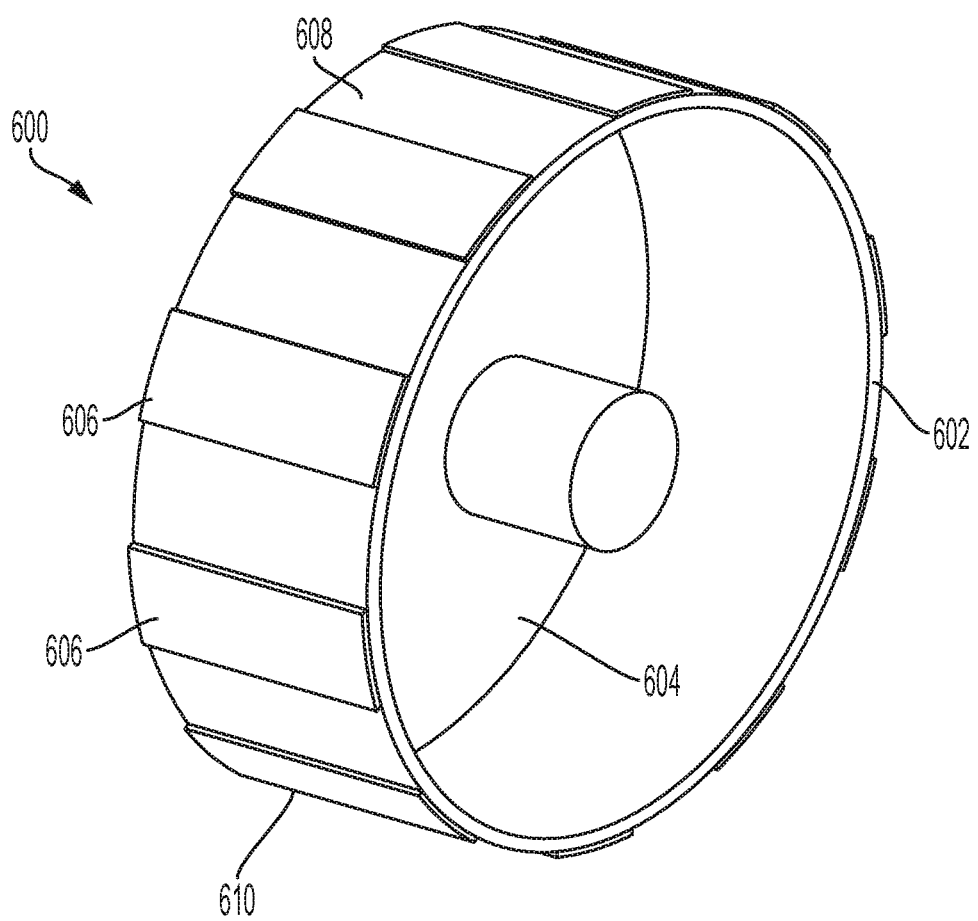
FIG. 6 is a depiction of a three-dimensional encoder, in an example embodiment.

FIG. 6 is a depiction of a three-dimensional encoder 600, in an example embodiment. The three-dimensional encoder 600 may function as the three-dimensional encoder 310 in the optical encoder unit 210. The three-dimensional encoder 600 is a drum encoder, including a drum portion 602 and a securing portion 604 coupled to the cylindrical portion and configured to secure the three-dimensional encoder 600 to e.g., a motor shaft. The securing portion may be solid or may be individual portions that extend between the drum portion 602 and the motor, e.g., spokes or the like.

As illustrated, the drum portion 602 is cylindrical and has a circular cross section, though any of a variety of suitable geometries are contemplated, including conical, octagonal, and the like. As with the two-dimensional disk 300, the drum 600 includes a first plurality of segments 606, e.g., dark segments, alternatingly positioned between a second plurality of segments 608, e.g., reflective segments. The first and second plurality of segments 606, 608 are positioned on an exterior surface 610 of the drum portion 602.

Figure 7:
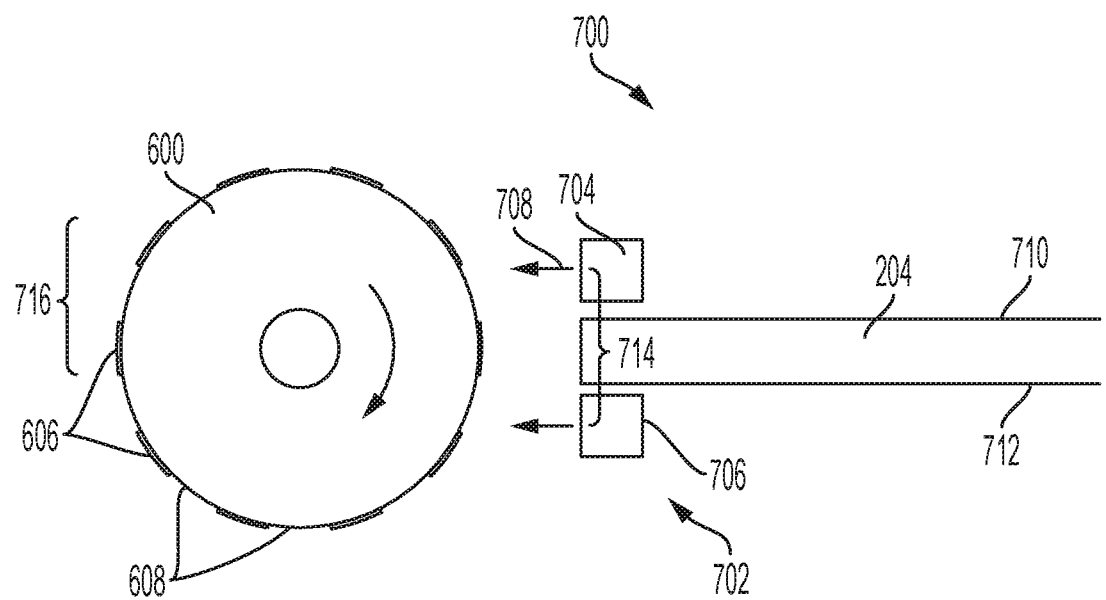
FIG. 7 is a depiction of an optical encoder, including the three-dimensional encoder, in an example embodiment.

FIG. 7 is a depiction of an optical encoder unit 700, including the three-dimensional encoder 600, in an example embodiment. The optical encoder 700 may operate as the optical encoder 210 in the block diagram of FIG. 2. In addition to the three-dimensional encoder 600, the optical encoder 700 includes an optical sensor 702, including a first optical sensor 704 and a second optical sensor 706 each within an optical range 708 of the three-dimensional encoder 600, the optical range 708 being a distance over which the first and second optical sensors 704, 706 can differentiate between the first and second plurality of segments 606, 608. As such, the optical range 708 will be different between and among different types of first and second optical sensors 704, 706. In the event that external design requirements may necessitate a specific distance between the optical sensor 702 and the three-dimensional encoder 600, first and second optical sensors 704, 706 may be selected that have an optical range 708 at least as long as the distance.

The first optical sensor 704 is positioned on a first major surface 710 of the main PCB 204 while the second optical sensor 708 is positioned on a second major surface 712 of the main PCB 204. In the illustrated example, the first and second optical sensors 704, 706 have a vertical spacing 714 approximately equal to a height 716 of each individual one of the first and second plurality of segments 606, 608, e.g., within approximately five (5) percent of the height 716. As such, each of the first and second optical sensors 704, 706 will both tend to detect the same type of segment, i.e., will both detect dark segments or reflective segments. If each of the first and second optical sensors 704, 706 do not detect the same type of segment, e.g., the first optical sensor 704 detects one of the first plurality of segments 606 and the second optical sensor 706 detects one of the second plurality of segments 608 (or vice versa), the inconsistency may be expected to be resolved soon in favor of both the first and second optical sensor 704, 706 detecting the same type of segment 606, 608.

While a particular configuration of the optical sensor 702 is illustrated, it noted and emphasized that the number and orientation of optical sensors may be varied between and among different implementations. Thus, in an example an alternative example of the optical sensor 702 may have only one individual optical sensor, while a further alternative example of the optical sensor 702 may include three or more individual optical sensors. However, in various examples, each optical sensor is positioned on one of the major surfaces 710, 712 of the main PCB 204.

Figure 8A:
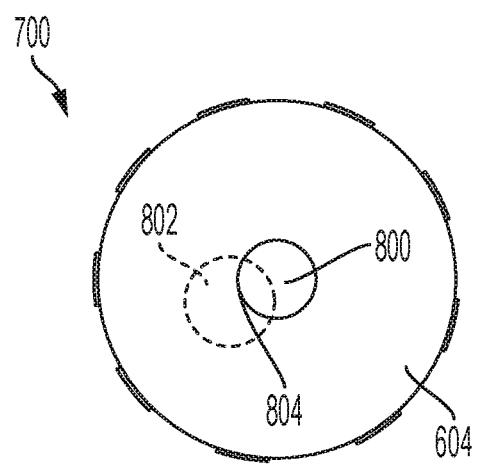
FIGS. 8A-8C illustrate the operation of an optical encoder which is off center relative to a major axis of the optical encoder, in an example embodiment.
Figure 8B:
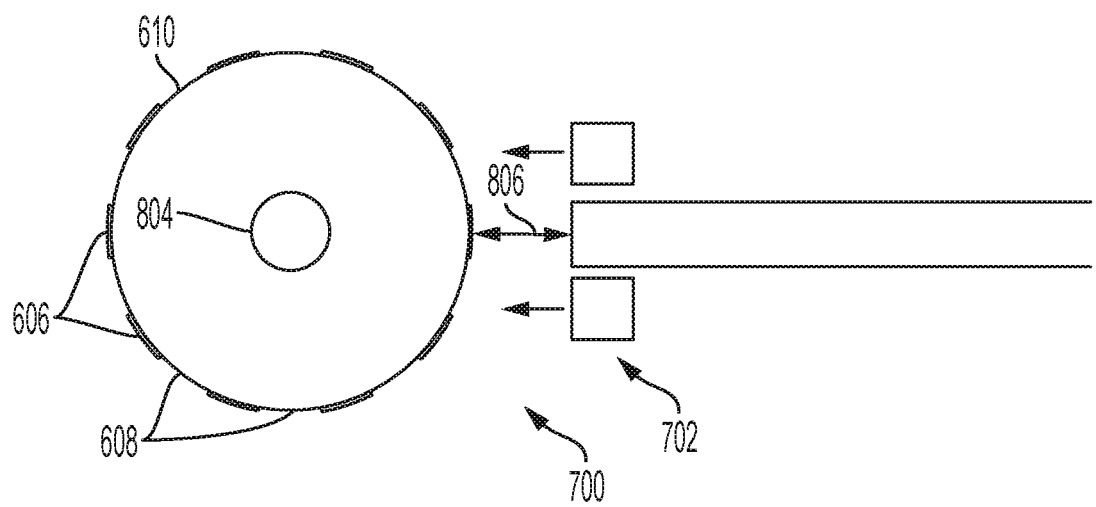
Figure 8C:
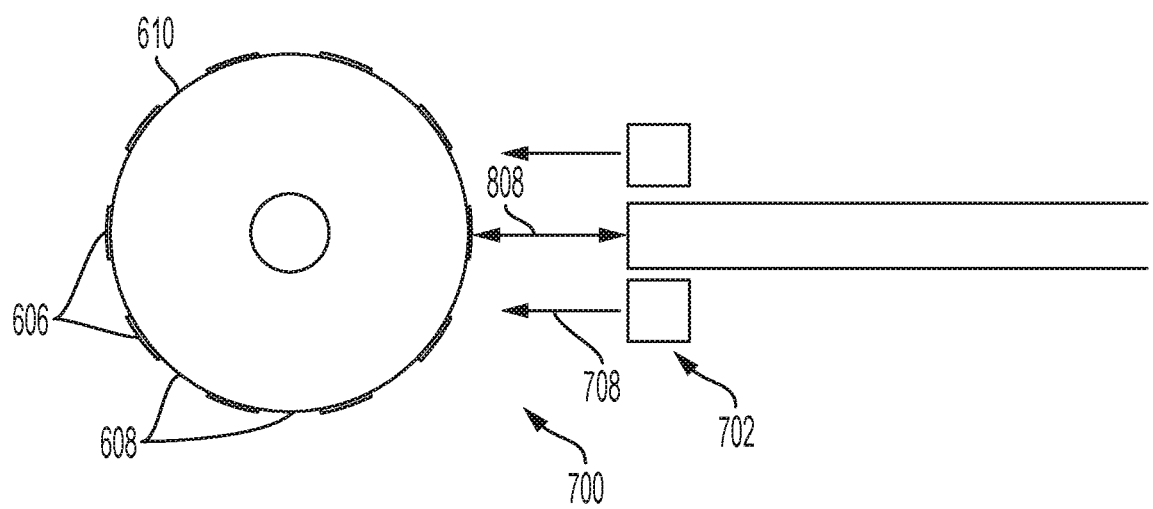

FIGS. 8A-8C illustrate the operation of an optical encoder unit 700 which is off center relative to a major axis 800 of the optical encoder 700, in an example embodiment. In FIG. 8A, a center 802 of an aperture 804 in the securing section 604 through which the motor shaft 306 may pass is offset by distance relative to the major axis 800. In FIG. 8B, with the aperture 804 fixed about the shaft, the exterior surface 610 and, by extension, the first and second plurality of segments 606, 608, come to within a first distance 806 of the optical sensor 702. In FIG. 8C, the optical encoder 700 having completed a half-rotation relative to in FIG. 8B, the exterior surface 610 comes to within a second distance 808 of the optical sensor 702, the second distance 808 being greater than the first distance 806, owing to the off-center aperture 804 being fixed about the motor shaft.

Offsets between the major axis 800 and the center 802 of the aperture may be an unintended consequence of a manufacture process. However, because of the properties of the optical sensor 700, the apparent height 716 (FIG. 7) of each of the first and second plurality of segments 606, 608 may remain the same. As a result, such concentricity issues may merely result in a difference in focal distance of the optical sensor 702. Differences in the focal distance may be resolved by the optical sensor 702 within the optical range 708 of the optical sensor 702. As such, the optical encoder 700 may allow for greater variance in a manufacturing process than may be allowed in a manufacturing process of the optical encoder 300, as well as be more robust to normal wear and tear during use.

Figure 9:
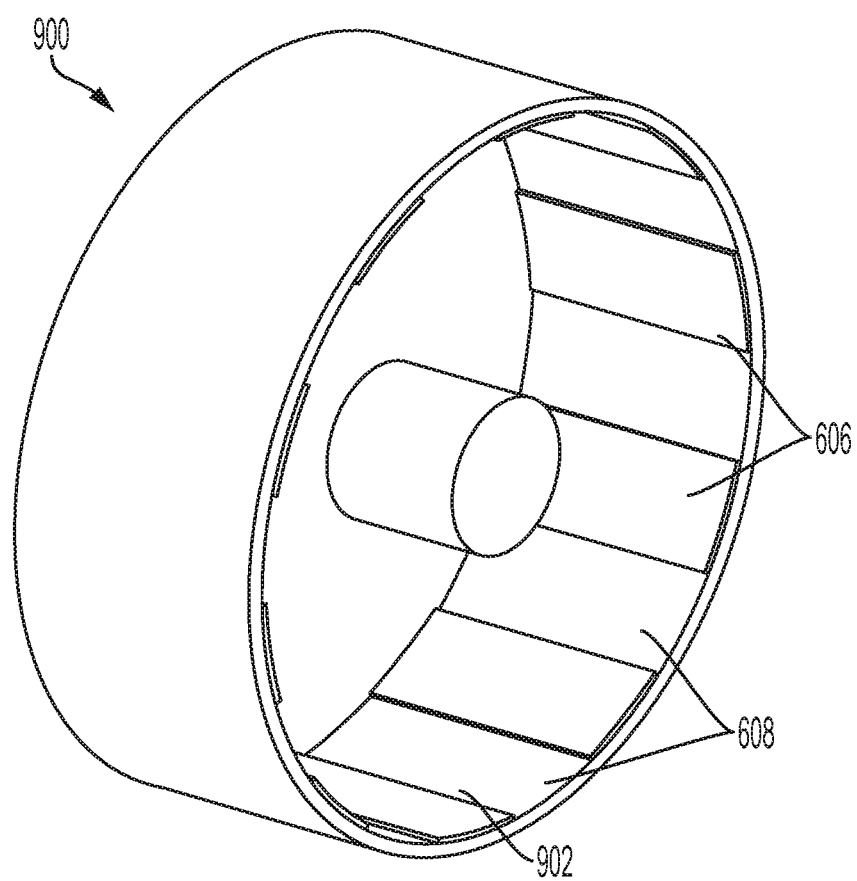
FIG. 9 is a depiction of an alternative example of a three-dimensional encoder, in an example embodiment.

FIG. 9 is a depiction of an alternative example of a three-dimensional encoder 900, in an example embodiment. The three-dimensional encoder 900 may otherwise have the same properties as the three-dimensional encoder 600. But rather than having the first and second plurality of segments 606, 608 on an outside surface of the drum portion 602, the three-dimensional encoder 900 includes the first and second plurality of segments 606, 608 on an interior surface 902. The three-dimensional encoder 900 may otherwise be utilized in an arrangement similar to that of the optical sensor 700, with the optical sensors 702 positioned to sense the interior surface 902.

Figure 10A:
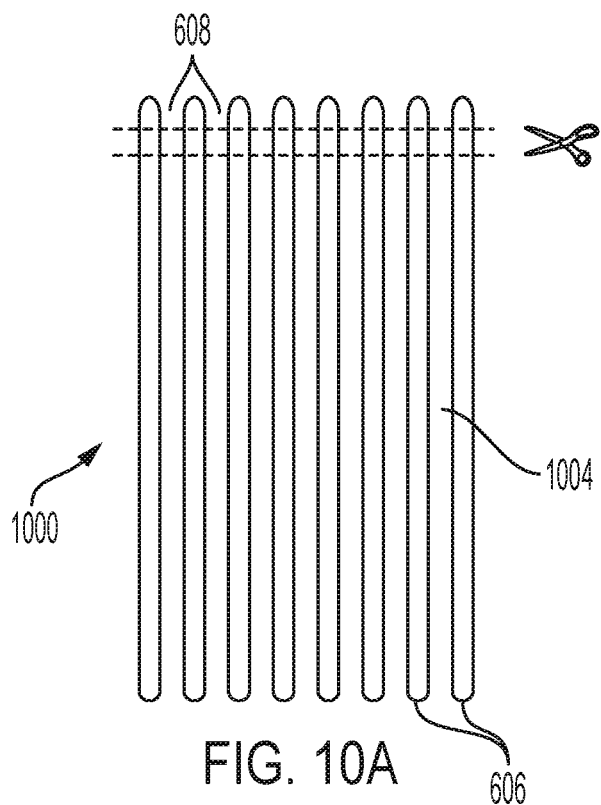
FIGS. 10A-10C illustrate a manufacturing process for the three-dimensional encoders, in an example embodiment.
Figure 10B:
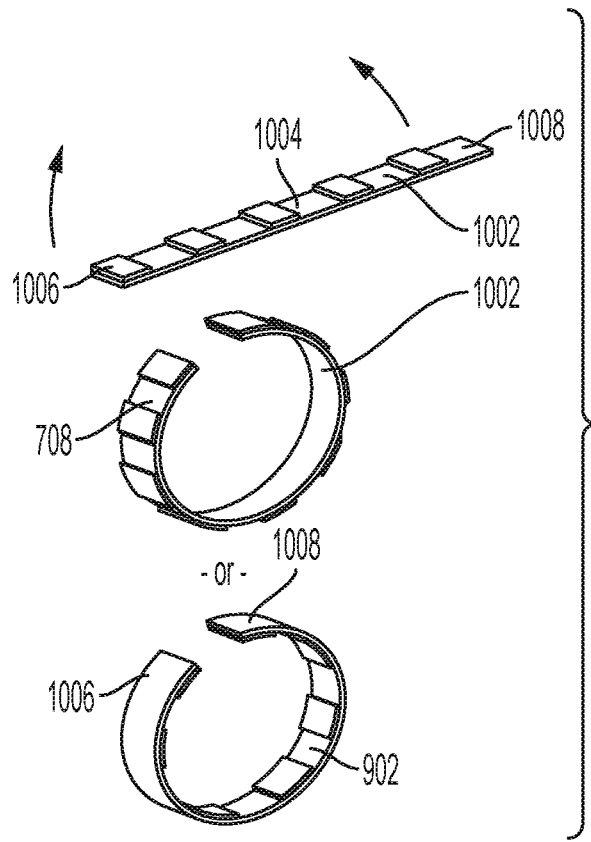
Figure 10C:
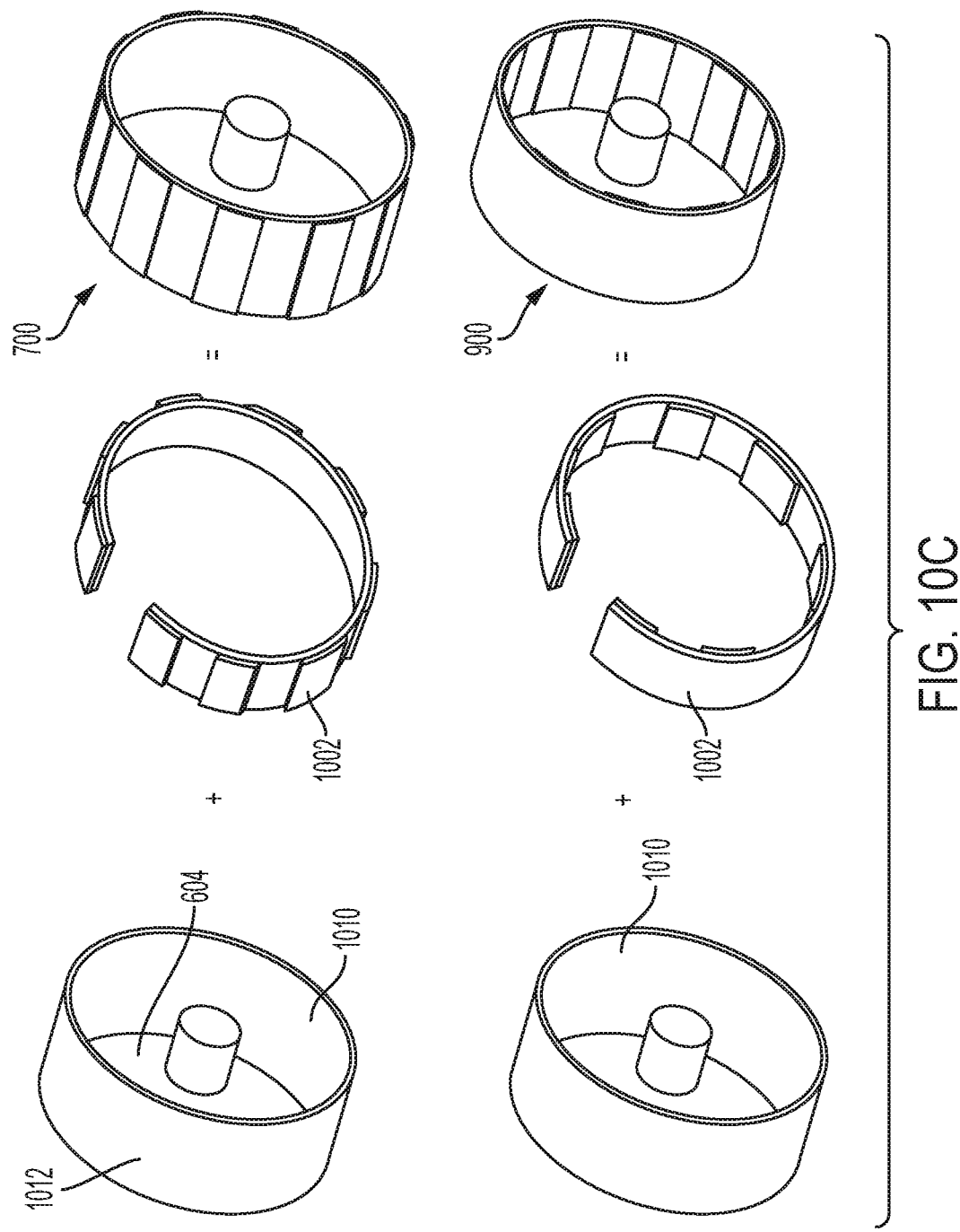

FIGS. 10A 10C illustrate a manufacturing process for the three-dimensional encoders 700, 900, in an example embodiment.

In FIG. 10A, a sheet 1000 of elongate first and second plurality of segments 606, 608 is cut into individual strips 1002. The sheet 1000 is made of any suitable material, such as Mylar, and the dark segments, e.g., the first plurality of segments 606, are printed onto a major surface 1004 of sheet 1000. The reflective segments, e.g., the second plurality of segments 608, are untreated or substantially untreated Mylar.

In FIG. 10B, the strip 1002 is folded so that the major surface 1004, i.e., the printed side, is either on an exterior surface 708 or an interior surface 902, as desired. A first end 1006 is secured to a second end 1008 to make a loop.

In FIG. 10C, the strip 1002 is coupled to a frame 1010 to form the three-dimensional encoder 700, 900, as desired. The frame 1010 includes the securing portion 604 and a drum 1012 on which to fix the strip 1002 to form the drum portion 602.

Figure 11:
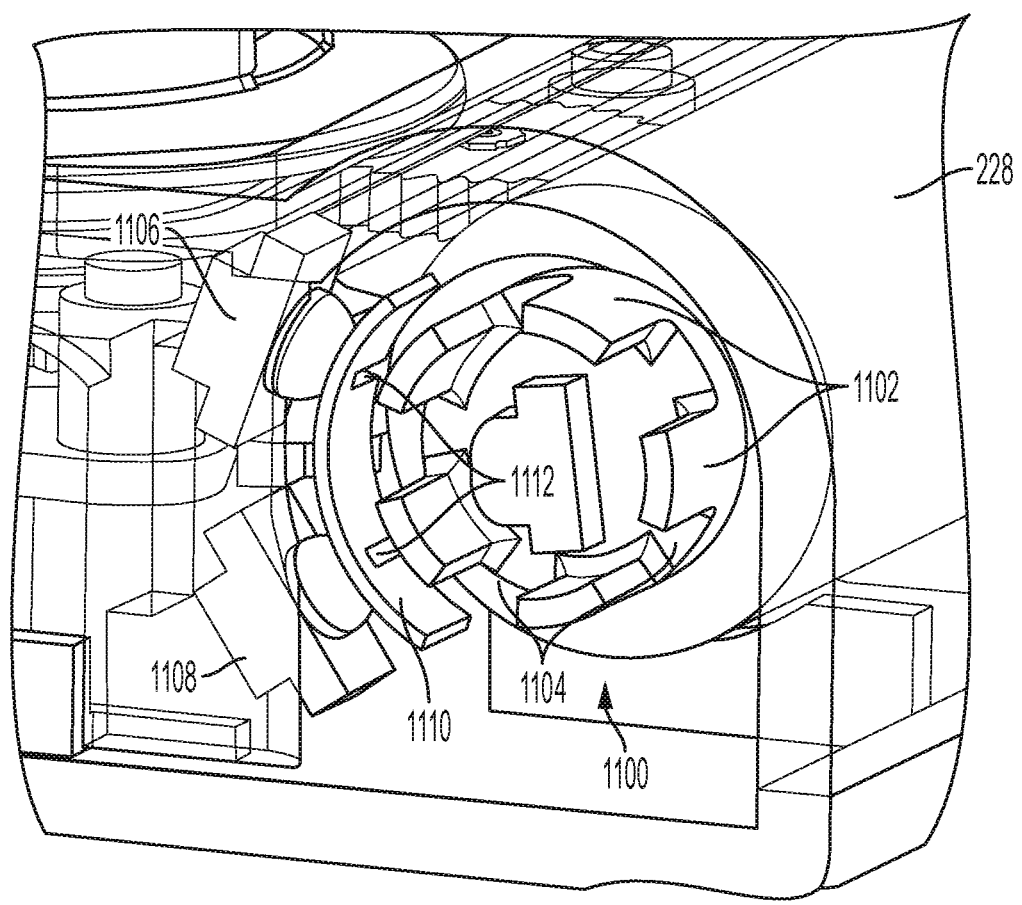
FIG. 11 is an illustration of a three-dimensional encoder 1100, in an example embodiment.

FIG. 11 is an illustration of a three-dimensional encoder 1100, in an example embodiment. Unlike the three-dimensional encoders 700, 900, the three-dimensional encoder 1100 utilizes tabs 1102 and gaps 1104 to provide surfaces or lack thereof from light is either reflected, in the case of the tabs 1102, or not reflected, in the case of the gaps 1104. The optical sensors 1106, 1108 detect the light reflected from the tabs 1102 and not the absence of reflected light when the gaps 1104 align with the optical sensors 1106, 1108. In an example, the optical sensor 1106, 1108 form an angle therebetween of approximately fifty-four (54) degrees. A beam break 1110 includes slits 1112 through which light passes to focus the light for the purposes of the focusing the light for detection by the optical sensors 1106, 1108, The three-dimensional encoder 1100 is rotationally coupled to the motor 228, as with the other encoders 700, 900.

EXAMPLES

In Example 1, an article of footwear includes a midsole, an upper secured with respect to the midsole, a lace extending through the upper, and a motorized lacing system positioned within the midsole, configured to engage with the lace to increase and decrease tension on the lace, the motorized lacing system comprising a motor, a transmission, operatively coupled to the motor, a power source, operatively coupled to the motor, a lace spool, operatively coupled to the motor via the transmission, configured to spool and unspool the lace based on operation of the motor, a printed circuit board, and a housing, containing the motor, the transmission, the power source, the lace spool and the printed circuit hoard, the printed circuit board positioned between an interior surface of the housing and at least one of the power source and the motor, wherein the interior surface includes a post that extends through a hole formed in the printed circuit board, wherein a flexing of the interior surface causes force on the housing to be at least partially imparted on the at least one of the power source, the transmission, and the motor.

In Example 2, the article of footwear of Example 1 optionally further includes that flexing the interior surface of the housing causes the post to impact the at least one of the power source, the transmission, and the motor.

In Example 3, the article of footwear of any one or more of Examples 1 and 2 optionally further includes that the interior surface includes a plurality of posts configured so that, upon flexing of the interior surface of the housing, at least one of the posts imparts the force on at least one of the power source, the transmission, and the motor.

In Example 4, the article of footwear of any one or more of Examples 1-3 optionally further includes that one of the plurality of posts is configured to impart the force on the transmission and another one of the plurality of posts is configured to impart the force on the motor.

In Example 5, the article of footwear of any one or more of Examples 1-4 optionally further includes that a spacing between the post and the at least one of the power source, the transmission, and the motor is less than a spacing between the printed circuit board and the interior surface.

In Example 6, the article of footwear of any one or more of Examples 1-5 optionally further includes that the post is constantly in contact with the at least one of the power source, the transmission, and the motor.

In Example 7, the article of footwear of any one or more of Examples 1-6 optionally further includes that the post is formed in the shape of a plus-symbol.

In Example 8, a method includes securing an upper secured with respect to a midsole, extending a lace through the upper, positioning a motorized lacing system within the midsole, the motorized lacing system configured to engage with the lace to increase and decrease tension on the lace, the motorized lacing system comprising a motor, a transmission, operatively coupled to the motor, a power source, operatively coupled to the motor, a lace spool, operatively coupled to the motor via the transmission, configured to spool and unspool the lace based on operation of the motor, a printed circuit board, and a housing, containing the motor, the transmission, the power source, the lace spool and the printed circuit board, the printed circuit board positioned between an interior surface of the housing and at least one of the power source and the motor, wherein the interior surface includes a post that extends through a hole formed in the printed circuit board, wherein a flexing of the interior surface causes force on the housing to be at least partially, imparted on the at least one of the power source, the transmission, and the motor.

In Example 9, the method of Example 8 optionally further includes that flexing the interior surface of the housing causes the post to impact the at least one of the power source, the transmission, and the motor.

In Example 10, the method of any one or more of Examples 8 and 9 optionally further includes that the interior surface includes a plurality of posts configured so that, upon flexing of the interior surface of the housing, at least one of the posts imparts the force on at least one of the power source, the transmission, and the motor.

In Example 11, the method of any one or more of Examples 8-10 optionally further includes that one of the plurality of posts is configured to impart the force on the transmission and another one of the plurality of posts is configured to impart the force on the motor.

In Example 12, the method of any one or more of Examples 8-11 optionally further includes that a spacing between the post and the at least one of the power source, the transmission, and the motor is less than a spacing between the printed circuit board and the interior surface.

In Example 13, the method of any one or more of Examples 8-12 optionally further includes that the post is constantly in contact with the at least one of the power source, the transmission, and the motor.

In Example 14, the method of any one or more of Examples 8-13 optionally further includes that the post is formed in the shape of a plus-symbol.

In Example 15, a motorized lacing system comprises a motor, a transmission, operatively coupled to the motor, a power source, operatively coupled to the motor, a lace spool, operatively coupled to the motor via the transmission, configured to spool and unspool the lace based on operation of the motor, a printed circuit board, and a housing, containing the motor, the transmission, the power source, the lace spool and the printed circuit board, the printed circuit board positioned between an interior surface of the housing and at least one of the power source and the motor, wherein the interior surface includes a post that extends through a hole formed in the printed circuit board, wherein a flexing of the interior surface causes force on the housing to be at least partially imparted on the at least one of the power source, the transmission, and the motor.

In Example 16, the motorized lacing system of Example 15 optionally further includes that flexing the interior surface of the housing causes the post to impact the at least one of the power source, the transmission, and the motor.

In Example 17, the motorized lacing system of any one or more of Examples 15 and 16 optionally further includes that the interior surface includes a plurality of posts configured so that, upon flexing of the interior surface of the housing, at least one of the posts imparts the force on at least one of the power source, the transmission, and the motor.

In Example 18, the motorized lacing system of any one or more of Examples 15-17 optionally further includes that one of the plurality of posts is configured to impart the force on the transmission and another one of the plurality of posts is configured to impart the force on the motor.

In Example 19, the motorized lacing system of any one or more of Examples 15-18 optionally further includes that a spacing between the post and the at least one of the power source, the transmission, and the motor is less than a spacing between the printed circuit board and the interior surface.

In Example 20, the motorized lacing system of any one or more of Examples 15-19 optionally further includes that the post is constantly in contact with the at least one of the power source, the transmission, and the motor.

In Example 21, the motorized lacing system of any one or more of Examples 15-20 optionally further includes that the post is formed in the shape of a plus-symbol.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor; for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. 1t is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

What is claimed is:

1. An article of footwear, comprising:
a midsole;
an upper secured with respect to the midsole;
a lace extending through the upper; and
a motorized lacing system positioned within the midsole, configured to engage with the lace to increase and decrease tension on the lace, the motorized lacing system comprising:
a motor;
a transmission, operatively coupled to the motor;
a power source, operatively coupled to the motor;
a lace spool, operatively coupled to the motor via the transmission, configured to spool and unspool the lace based on operation of the motor;
a printed circuit board; and
a housing, containing the motor, the transmission, the power source, the lace spool and the printed circuit board, the printed circuit board positioned between an interior surface of the housing and at least one of the power source and the motor, wherein the interior surface includes a post that extends through a hole formed in the printed circuit board, wherein a flexing of the interior surface causes at least some force on the housing to be imparted on the at least one of the power source, the transmission, and the motor.

2. The article of footwear of claim 1, wherein flexing the interior surface of the housing causes the post to impact the at least one of the power source, the transmission, and the motor.

3. The article of footwear of claim 1, wherein the interior surface includes a plurality of posts configured so that, upon flexing of the interior surface of the housing, at least one of the posts imparts the force on at least one of the power source, the transmission, and the motor.

4. The article of footwear of claim 3, wherein one of the plurality of posts is configured to impart the force on the transmission and another one of the plurality of posts is configured to impart the force on the motor.

5. The article of footwear of claim 1, wherein a spacing between the post and the at least one of the power source, the transmission, and the motor is less than a spacing between the printed circuit board and the interior surface.

6. The article of footwear of claim 1, wherein the post is constantly in contact with the at least one of the power source, the transmission, and the motor.

7. The article of footwear of claim 1, wherein the post is formed in the shape of a plus-symbol.

\* \* \* \* \*